United States Patent
Nakamura (10) Patent No.: US 9,064,634 B2
(45) Date of Patent: Jun. 23, 2015

(54) CAPACITOR HOLDER

(75) Inventor: Tatsuya Nakamura, Nagoya (JP)

(73) Assignee: Kitagawa Industries Co., Ltd., Inazawa-shi, Aichi (JP)

( * ) Notice: Subject to any disclaimer, the term of this patent is extended or adjusted under 35 U.S.C. 154(b) by 244 days.

(21) Appl. No.: 13/817,964

(22) PCT Filed: Aug. 23, 2011

(86) PCT No.: PCT/JP2011/068943
§ 371 (c)(1), (2), (4) Date: Feb. 20, 2013

(87) PCT Pub. No.: WO2012/026454
PCT Pub. Date: Mar. 1, 2012

(65) Prior Publication Data
US 2013/0140079 A1      Jun. 6, 2013

(30) Foreign Application Priority Data
Aug. 25, 2010   (JP) ................................ 2010-188509

(51) Int. Cl.
*H05K 7/14* (2006.01)
*H01L 23/48* (2006.01)
(Continued)

(52) U.S. Cl.
CPC . *H01G 2/10* (2013.01); *H01G 2/06* (2013.01); *H01G 9/08* (2013.01); *H01G 9/12* (2013.01); *H05K 3/301* (2013.01); *H05K 3/3447* (2013.01); *H05K 2201/10462* (2013.01); *H05K 2201/10583* (2013.01); *H05K 2201/10606* (2013.01); *H05K 2201/10651* (2013.01)

(58) Field of Classification Search
USPC .................. 174/535, 551; 361/310, 520, 535; 439/500
See application file for complete search history.

(56) References Cited

U.S. PATENT DOCUMENTS 3,111,612 A * 11/1963 Lehmann .................... 361/301.3
5,016,139 A *  5/1991 Stopa et al. ................... 361/720
(Continued)

FOREIGN PATENT DOCUMENTS

CN         101557063 A       10/2009
JP             552660         2/1956
(Continued)

OTHER PUBLICATIONS

International Preliminary Report on Patentability issued for corresponding PCT Application No. PCT/JP2011/068943 mailed Feb. 28, 2013.
(Continued)

*Primary Examiner* — Timothy Thompson
*Assistant Examiner* — Sherman Ng
(74) *Attorney, Agent, or Firm* — Davis & Bujold, P.L.L.C.; Michael J. Bujold (57) ABSTRACT

A capacitor holder comprising a body part formed in a shape into which a tip end of a capacitor can be fitted; and a lead part which is fixed to the body part and can be soldered to a predetermined fitting location. The body part has an opening through which the tip end of the capacitor is exposed, and an end surface abutment portion which abuts a tip end surface of the capacitor in a vicinity of a pressure valve, when the tip end of the capacitor is fitted into the body part. The lead part is fixed to the body part at a position opposite to the capacitor with respect to a reference plane, which is a plane includes the tip end surface of the capacitor abutting the end surface abutment portion.

16 Claims, 5 Drawing Sheets (51) Int. Cl.
  *H01G 4/248* (2006.01)
  *H01G 4/228* (2006.01)
  *H01G 2/10* (2006.01)
  *H01R 3/00* (2006.01)
  *H01G 2/06* (2006.01)
  *H01G 9/08* (2006.01)
  *H01G 9/12* (2006.01)
  *H05K 3/30* (2006.01)
  *H05K 3/34* (2006.01)

(56) References Cited

U.S. PATENT DOCUMENTS

| | | | |
|---|---|---|---|
| 5,921,820 A * | 7/1999 | Dijkstra | 439/751 |
| 5,978,203 A * | 11/1999 | Kiyomura et al. | 361/301.3 |
| 6,323,440 B1 * | 11/2001 | Maruyama et al. | 174/262 |
| 2004/0136170 A1 | 7/2004 | Tsunezaki et al. | 361/810 |
| 2009/0257199 A1 | 10/2009 | Henderson | |
| 2010/0267252 A1 | 10/2010 | Fujimoto | |
| 2012/0044661 A1 * | 2/2012 | Chan et al. | 361/811 |

FOREIGN PATENT DOCUMENTS

| | | |
|---|---|---|
| JP | 58 47 232 | 10/1983 |
| JP | 60-121324 | 8/1985 |
| JP | 92 703 58 | 10/1997 |
| JP | 102 08 984 | 8/1998 |
| JP | 1065355 | 3/2000 |
| JP | 1065355-1 | 3/2000 |
| JP | 2000 277 366 | 10/2000 |
| JP | 1116009 | 7/2001 |
| JP | 2008 124 244 | 5/2008 |
| JP | 1360656 | 6/2009 |
| JP | 1360657 | 6/2009 |
| JP | 1360658 | 6/2009 |
| JP | 1360659 | 6/2009 |
| JP | 2009 259 825 | 11/2009 |
| JP | 1373809 | 11/2009 |
| JP | 2010177348 A | 8/2010 |
| JP | 2011 187 627 | 9/2011 |

OTHER PUBLICATIONS

International Search report completed on Nov. 7, 2011 for corresponding PCT Application No. PCT/JP2011/068943 Mailed Nov. 15, 2011.

Chinese Office Action issued in corresponding Chinese Patent Application No. 201180040555.3 mailed Feb. 12, 2015.

* cited by examiner

CAPACITOR HOLDER

CROSS-REFERENCE TO RELATED APPLICATIONS

This international application is a national stage completion of PCT/JP2011/068943 filed Aug. 23, 2011 which claims the benefit of Japanese Patent Application No. 2010-188509 filed Aug. 25, 2010 in the Japan Patent Office, and the entire disclosure of which is incorporated herein by reference.

TECHNICAL FIELD

The present invention relates to a capacitor holder that holds a capacitor to be mounted on a printed wiring board at a predetermined position.

BACKGROUND ART

Recently, with a trend of smaller and thinner electronic equipment, electronic components to be mounted on a printed wiring board are also required to have a lower height (i.e., to be of lower height on a printed wiring board).

Under such circumstances, even a capacitor, which has a relatively high height on the printed wiring board when mounted upright on the printed wiring board, is sometimes disposed on its side on the printed wiring board (i.e., disposed such that its longitudinal direction is substantially parallel to a surface of the printed wiring board) in order to reduce an amount of its projection.

Also, in case that the capacitor is disposed on its side as described above, it has been also proposed to retain the capacitor on its side by means of a capacitor holder installed on the printed wiring board (e.g., see Patent Document 1 below).

A capacitor holder according to Patent Document 1 (a mounting leg (7) in Patent Document 1) includes a holder body made of an insulating material such as epoxy resin, and metal leads (third projections (11a), (11b) in Patent Document 1) provided on the holder body (see paragraph [0010] in Patent Document 1).

PRIOR ART DOCUMENTS

Patent Documents

Patent Document 1: Japanese Unexamined Patent Application Publication No. 10-208984

SUMMARY OF THE INVENTION

Problems to be Solved by the Invention

In the capacitor holder described in Patent Document 1, it is necessary to ensure that the metal leads have a certain degree of thickness in consideration of strength, etc. In addition, since part of the metal leads is embedded in a resin portion of the holder body, it is necessary to ensure that also the resin portion surrounding the embedded portion has a certain size in consideration of strength, etc. Therefore, such resin portion in which the metal leads are embedded has a correspondingly bulky structure.

However, the capacitor holder that is described in Patent Document 1 has the structure that holds the capacitor from its sides between both longitudinal ends of the capacitor. Thus, the portion having a bulky structure as described above is to be disposed at the sides of the capacitor.

Therefore, if the capacitor holder described in the above Patent Document 1 is used when, for example, a plurality of capacitors are intended to be mounted in parallel, the portion having a bulky structure is interposed between the adjacent capacitors. Thus, there is a problem that package density of the capacitors decreases by the bulky structure.

The present invention has been made to solve the above problems. The object of the present invention is to provide a capacitor holder in which, when a plurality of capacitors are mounted in parallel, intervals to be secured between the adjacent capacitors can be reduced more than those in conventional capacitor holders.

Means for Solving the Problems

A configuration employed in the present invention will be described hereinafter.

A capacitor holder in a first aspect of the present invention includes a body part and a lead part. The body part is formed of an electrically insulating material, and is formed in a shape into which a tip end of a capacitor can be fitted. The lead part is formed of a metal material, and is fixed to the body part. The lead part can be soldered to a predetermined fitting location. The capacitor holder can hold the capacitor at the predetermined fitting location when the tip end of a capacitor is fitted into the body part and the lead part is soldered to the predetermined fitting location. The body part has an abutment portion which abuts a tip end surface of the capacitor, when the tip end of the capacitor is fitted into the body part. The lead part can be capacitively coupled to a case which is an exterior of the capacitor. The lead part is fixed to the body part at a position opposite to the capacitor with respect to a reference plane. The reference plane is a plane including the tip end surface of the capacitor abutting the abutment portion.

In the capacitor holder of the present invention, the capacitor can be various types of capacitors, which includes an electrolytic capacitor. An electrolytic capacitor in general includes a cylindrical case. A lead extends from one end of the case. A pressure valve which expands or bursts when there is excessive internal pressure is provided at the other end of the case. In the following description, a longitudinal direction of the capacitor means an axial direction of the above described cylindrical case, and a radial direction of the capacitor means a radial direction of the above described cylindrical case. In addition, the tip end of the capacitor means the other end of the above described case (i.e., an end at which the lead is not provided).

According to a capacitor holder of the present invention, it is possible to hold the capacitor fitted into the body part at the fitting location. Thus, even if vibration or shock is transmitted to the capacitor, it is possible to prevent an excessive load from being applied to the capacitor due to the vibration or shock.

Further, in this capacitor holder, the lead part is fixed to the body part at a position opposite to the capacitor with respect to the above-mentioned reference plane. Therefore, even if an end surface side structure of the capacitor becomes bulky due to presence of the lead part, a lateral structure of the capacitor does not have a bulky structure.

Therefore, in the above-described capacitor holder, a dimension corresponding to a radial direction of the capacitor can be reduced, even if a dimension corresponding to a longitudinal direction of the capacitor increases as compared to a capacitor holder of which lead part is disposed on a lateral side of the capacitor (e.g., capacitor holder described in Patent Document 1 described above). Thus, upon mounting a plurality of capacitors in parallel, intervals to be secured between the adjacent capacitors can be reduced as compared to a conventional capacitor holder, if the capacitor holder of the present invention is used.

Also, when the lead part is at the position opposite to the capacitor with respect to the above described reference plane, and if a force to move the capacitor in a direction away from the printed wiring board is applied to the capacitor and to the capacitor holder, the capacitor holder attempts to be displaced in a direction to fall with the lead part as a center of rotation. Therefore, as compared to a case where the force acting from the capacitor becomes a force to pull straight out the lead part, the capacitor holder is less likely to be pulled out from the printed wiring board.

In, a preferred embodiment of the present invention, the body part of the capacitor holder has an opening. When a capacitor (electrolytic capacitor) having a pressure valve is held in the capacitor holder of the present invention, the opening of the body part exposes the pressure valve provided at the tip end of the capacitor. Thus, the capacitor holder can be fitted without obstructing the function of the pressure valve.

Moreover, since the tip end of the capacitor is fitted into the body part and the tip end of the capacitor is surrounded by the body part, in a portion other than the opening, the body part suppresses rupture of the electrolytic capacitor in the portion other than the opening exposing the pressure valve.

Therefore, if the capacitor holder holds the electrolytic capacitor, a direction of scattering of an electrolytic solution likely to be scattered due to the rupture can be restricted mainly to the longitudinal direction of the capacitor. Damage which may expand to a surrounding other than the longitudinal direction can be limited.

Since an exterior of the capacitor is formed by an aluminum case in general, the aluminum case sometimes may be a radiation source of high-frequency noise. In this regard, if the capacitor is held by the capacitor holder of the present invention, the metal lead part is provided in a vicinity of the aluminum case. Thus, even if a noise current flows through the aluminum case, the noise current falls to the ground through the lead part by capacitive coupling.

Therefore, the capacitor holder of the present invention not only simply holds the capacitor but also can take measures against high-frequency noise in the capacitor, different from a capacitor holder that is fixed to a printed wiring board by an electrically insulating member which is not a metal lead part.

A capacitor is an electronic component having a relatively large tolerance. There is some individual difference in its longitudinal dimension or diameter. Therefore, if the lead part is provided on the lateral side of the capacitor, there may be an individual difference in a distance between a lateral surface of the capacitor and the lead part due to a tolerance in the radial direction of the capacitor. Variations may be produced in effect on the measures against high-frequency noise mentioned as above.

In this regard, in a case of the capacitor holder of the present invention, when the capacitor is fitted into the body part, the tip end surface of the capacitor is brought into contact with the abutment portion, and thereby the distance between the tip end surface of the capacitor and the lead part becomes a distance set up on the capacitor holder side, regardless of the tolerance in the longitudinal direction of the capacitor.

Therefore, the capacitor holder of the present invention can stably exert the effect on measures against high-frequency noise as described above, regardless of the tolerance in the longitudinal direction of the capacitor.

In addition, upon holding the capacitor having a tolerance in the radial direction, if the lead parts are provided on the lateral side of the capacitor, the lead parts may be a factor that inhibits the body part from being expanded and deformed in the radial direction. In this case, if a distance between the lead parts is narrower, the capacitor having a larger diameter in a range of the tolerance may be held at an excessively high holding pressure by the capacitor holder. On the other hand, when the distance between the lead parts is broader, the capacitor having a small diameter in the range of the tolerance may come to a state unable to be properly held because the holding pressure by the capacitor holder is insufficient.

In this respect, in the capacitor holder of the present invention, because the lead part is provided on an end surface side of the capacitor, the lead part is less likely to be the factor to inhibit the body part from being expanded and deformed in the radial direction. Therefore, the holding pressure of the capacitor can not be too large or small at least due to the lead part. Optimization of the holding pressure also becomes easy.

Next, according to a capacitor holder in a second aspect of the present invention, the lead part, in the capacitor holder of the first aspect, is fixed to the body part at a position to overlap with the tip end surface of the capacitor, when viewed from a fitting direction upon fitting the tip end of the capacitor into the body part.

In the capacitor holder configured in this manner, since the lead part is at the position to overlap with the tip end surface of the capacitor, a force to displace the capacitor in the longitudinal direction, if applied to the capacitor, can receive the force at a portion having the lead part.

Therefore, as compared to a case in which the lead part is not at the position to overlap with the tip end surface of the capacitor, the force acting on the capacitor holder from the capacitor can be received more securely on the capacitor holder side. Displacement of the capacitor can be prevented more reliably.

Further, when the capacitor holder holds the electrolytic capacitor, and when the pressure valve on the tip end surface of the electrolytic capacitor ruptures due to abnormity of the capacitor, there is a risk that a force due to the rupture is applied to the capacitor holder. However, if the lead part is at the position to overlap with the tip end surface of the capacitor, the body part of the capacitor holder can be reinforced by the lead part. It is possible to inhibit the body part of the capacitor holder from being damaged by the rupture of the capacitor.

Next, according to a capacitor holder of a third aspect of the present invention, the lead part, in the capacitor holder of the second aspect, is constituted by a pair of metal bodies spaced apart. Portions continuous from one ends of the pair of metal bodies which are used for soldering extend parallel to part of a way to reach other ends of the pair of metal bodies, and are bent to directions to get closer to each other toward the other ends from a location part of the way. Portions which lead to the other ends from the location part of the way are fixed to the body part at the positions to overlap with the tip end surface of the capacitor, when viewed from the fitting direction upon fitting the tip end of the capacitor into the body part.

According to the capacitor holder configured in this way, an interval between the pair of metal bodies is narrowed at the other ends. The other ends are at the positions to overlap with the tip end surface of the capacitor. Thus, even when a distance between one ends is somewhat broad due to convenience of soldering, the other ends can be reliably disposed at the positions to overlap with the tip end surface of the capacitor.

According to a capacitor holder in a fourth aspect of the present invention, the pair of metal bodies, in the capacitor holder of the third aspect, are arranged at positions to pass through holes formed in the body part by being press-fitted into the through holes, and portions continuous from the other ends, out of portions that protrude from both sides of the through holes, are bent to the directions to get closer to each other.

According to the capacitor holder configured in this way, even if the metal bodies serving as the lead part are not arranged in a mold upon forming the body part using the mold, the lead part can be attached to the body part easily by press-fitting the metal bodies after molding of the body part.

According to a capacitor holder in a fifth aspect of the present invention, the body part, in the capacitor holder of the first to fourth aspects, includes an elastic pressuring piece which is elastically deformed when the tip end of the capacitor is fitted into the body part, to be in a state pressed against an outer peripheral surface of the capacitor.

According to the capacitor holder configured in this manner, it is possible to firmly hold the capacitor by the elastic pressuring piece. Even if there is a tolerance in a radial dimension of the capacitor, rattling in the capacitor can be prevented.

EXPLANATION OF REFERENCE NUMERALS

1 . . . capacitor holder, 3 . . . body part, 5 . . . lead part, 5A . . . wide width portion, 6 . . . capacitor, 5A . . . lead part, 6B . . . pressure valve, 11 . . . cylindrical portion, 13 . . . end surface abutting portion, 15 . . . leg, 17 . . . recess, 19 . . . opening, 21, 23 . . . convex portion, 25 . . . elastic pressuring piece.

MODE FOR CARRYING OUT THE INVENTION

Hereinafter, an embodiment of the present invention will be described by way of an example.

Figure 1A:
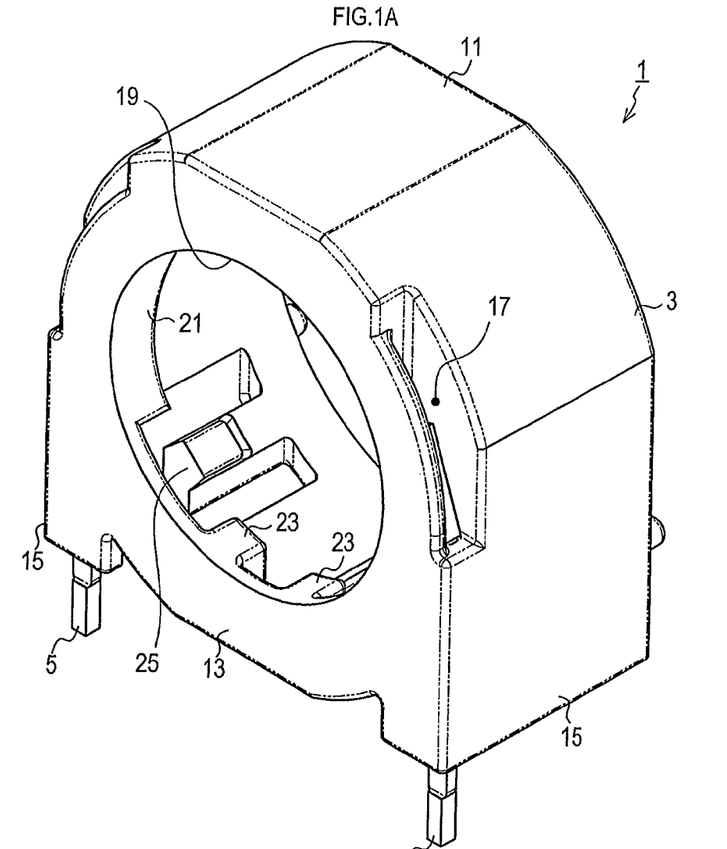
FIG. 1A is a drawing which shows a perspective view of a capacitor holder.

As shown in FIG. 1A, a capacitor holder 1 is provided with a body part 3 and a pair of lead parts 5. Of these, the body part 3 is formed of electrically insulating material (e.g., polyamide, polypropylene, polyethylene, etc.) and the lead parts 5 are formed of metal material (e.g., copper alloy).

Figure 1B:
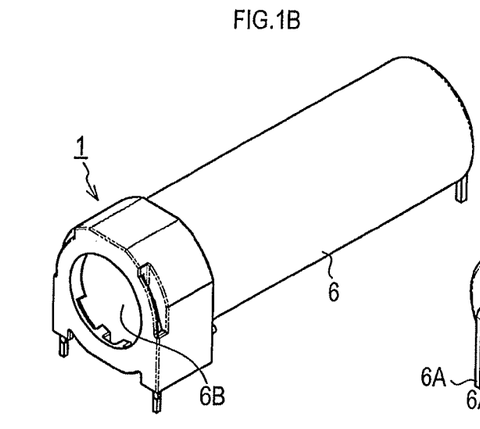
FIG. 1B is a perspective view showing a use state of the capacitor holder.
Figure 1C:
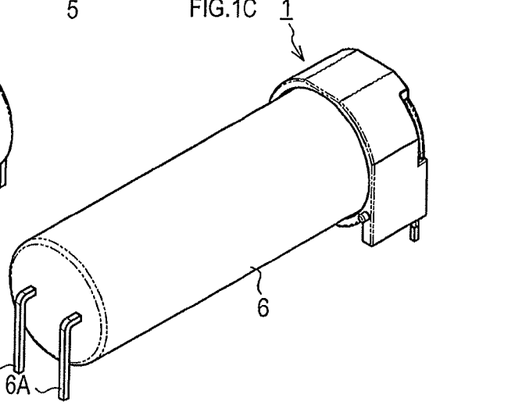
FIG. 1C is a perspective view showing the use state of the capacitor holder as seen from a different angle.

In the capacitor holder 1, a tip end of a capacitor 6 formed into a cylindrical shape is fitted into the body part 3, as shown in FIGS. 1B and 1C. Then, in this state, the lead parts 5 of the capacitor holder 1 and lead parts 6A of the capacitor 6 are soldered to a printed wiring board (not shown), whereby the capacitor holder 1 is mounted on the printed wiring board with the capacitor 6.

As a result, the capacitor 6 is in a state of being held by the capacitor holder 1 on the printed wiring board. As compared to a case in which the capacitor holder 1 is not provided, the capacitor 6 is held in place securely. In addition, even if vibration or shock is transmitted to the capacitor 6, it is possible to prevent an excessive load from being applied to the lead parts 6A of the capacitor 6 due to the vibration or shock.

Now, a detailed structure of the capacitor holder 1 will be described.

In the capacitor holder 1, the body part 3 has a tubular portion 11, an end surface abutting portion 13, and a pair of legs 15, as shown in FIGS. 2A to 2F. The tubular portion 11 surrounds the tip end of the capacitor 6 from an outer circumferential side of the capacitor 6 when the capacitor 6 is fitted into the body part 3. The end surface abutting portion 13 abuts an end surface circumferential edge of the capacitor 6 when the capacitor 6 is fitted into the body part 3. The legs 15 are formed on both left and right sides at a bottom of the tubular portion 11.

Figure 3A:
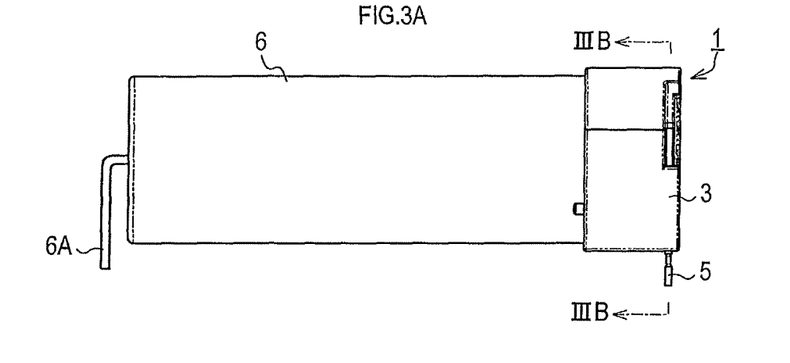
FIG. 3A is a left side view showing the use state of the capacitor holder.

At a boundary section with the end surface abutting portion 13 in an upper part of the tubular portion 11, a recess 17 is formed on each left and right side. Upper ends of the lead parts 5 are exposed to outside of the body part 3 in the recesses 17. Further, in the recesses 17, the pair of lead parts 5 are bent toward directions in which a distance between the upper ends of the lead parts 5 is to be narrowed (see FIGS. 3A and 3B).

Each of the lead parts 5 is positioned to pass a through hole formed in the body part 3 by being press-fitted into the through hole. After the lead parts 5 penetrate the through holes, portions continuous from upper ends, out of portions that protrude from upper and lower sides of the through holes, are bent toward directions in which the portions continuous from the upper ends come close to each other.

In order to fix the lead parts 5 to the body part 3 in this way, a wide width portion 5A having a partially expanded width is provided in part of each of the lead parts 5. Since the wide width portion 5A is press-fitted into the through hole, the lead part 5 does not come out of the through hole easily. In addition, after the portions continuous from the upper ends of the lead parts 5 are bent toward the directions in which the portions continuous from the upper ends come close to each other, the bent portions prevent the body part 3 from being pulled out upward of the lead parts 5.

If the lead parts 5 are attached to the body part 3 in this way, the lead parts 5 can be easily attached to the body part 3 by press-fitting metal bodies to be the lead parts 5 after forming of the body part 3, even if the metal bodies are not disposed in a mold for use in forming the body part 3.

Figure 3B:
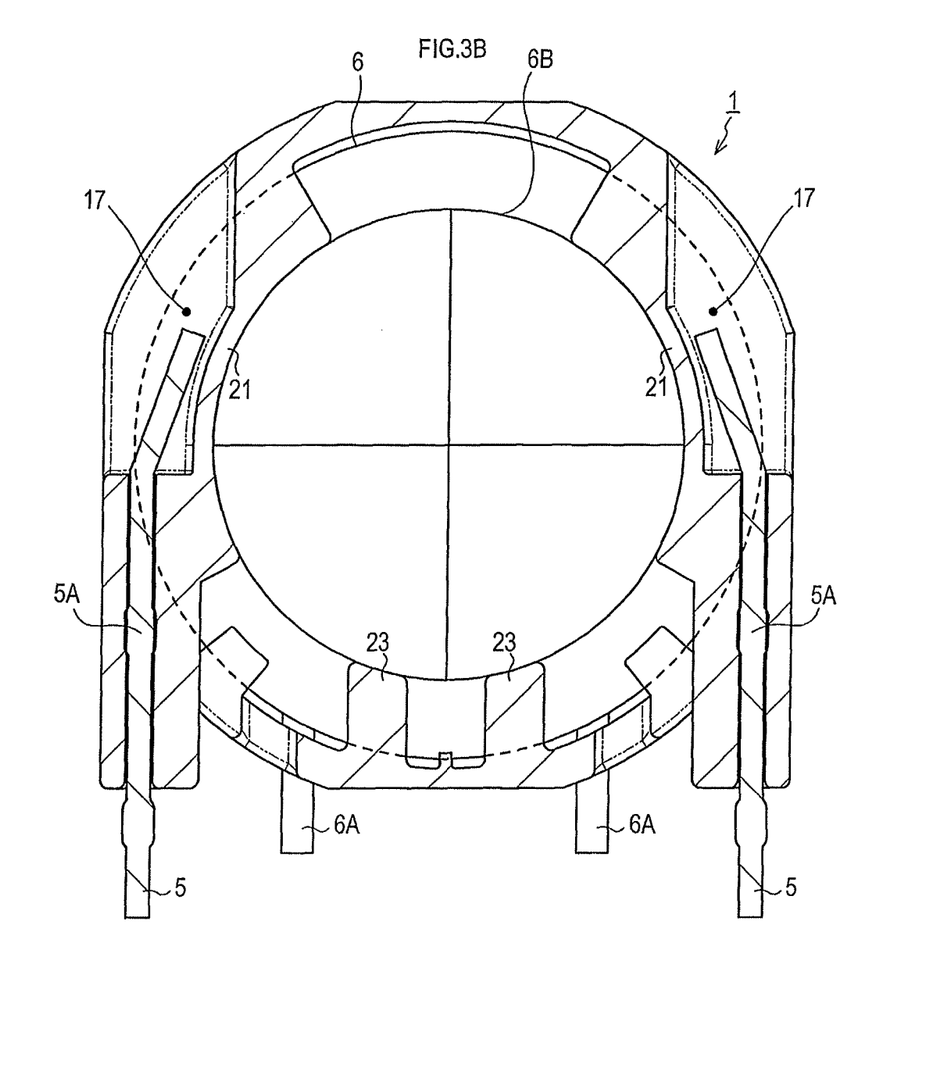
FIG. 3B is an explanatory view showing an enlarged cross-section taken along a line IIIB-IIIB shown in FIG. 3A.

In addition, as shown in FIG. 3B, the upper ends of the lead parts 5 bent in this way are at positions to overlap with the tip end surface of the capacitor 6. Therefore, in case that a force to displace the capacitor 6 toward its longitudinal direction is applied to the capacitor 6, the force can be received at sections where the lead parts 5 exist. Thereby, displacement of the capacitor 6 can be more reliably prevented.

Further, when a pressure valve 6B of the capacitor 6 is ruptured due to abnormality of the capacitor 6, there is a risk that a force due to the rupture is applied also to the capacitor holder 1. However, if the lead parts 5 are at the positions to overlap with the tip end surface of the capacitor 6, the body part 3 of the capacitor holder 1 can be reinforced with the lead parts 5. Also, it is possible to inhibit the body part 3 of the capacitor holder 1 from being damaged due to the rupture of the capacitor 6.

In addition, although the distance between the pair of lead parts 5 is narrowed at the upper ends, a distance between lower ends thereof is wider than the distance between the upper ends. Here, since soldering positions of the lower ends of the lead parts 5 are set in consideration of their mounting strength, it is sometimes difficult to ensure positioning both the lead parts 5 at the positions to overlap with the tip end surface of the capacitor 6 if there is a constant distance between the pair of lead parts 5 from the lower ends up to the upper ends. However, in this respect, by bending the upper ends of the lead parts 5 inwardly toward each other as described above, it is possible to ensure that the upper ends of the lead parts 5 are disposed at the positions to overlap with the tip end surface of the capacitor.

Figure 4A:
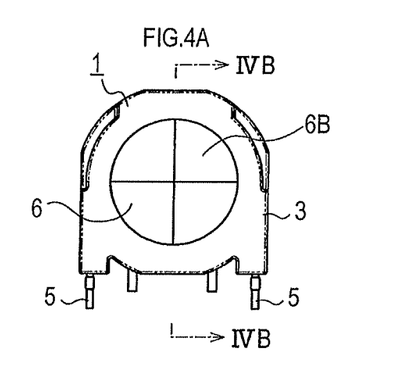
FIG. 4A is a front view showing the use state of the capacitor holder.

An opening 19 is formed near a center of the end surface abutting portion 13. When the capacitor 6 is fitted into the body part 3, the pressure valve 6B in the tip end surface of the capacitor 6 is exposed to the opening 19, as shown in FIG. 4A. Thus, if such opening 19 is provided, the capacitor holder 1 can be attached to the capacitor 6 without inhibiting the function of the pressure valve 6B.

In a section other than the opening 19, when the tip end of the capacitor 6 is fitted into the body part 3, the tip end of the capacitor 6 is therefore surrounded by the body part 3. Thus, in the section other than the opening 19 exposing the pressure valve 6B, the body part 3 inhibits rupture of the capacitor 6.

Thus, a direction of scattering of an electrolytic solution which is likely to be scattered due to the rupture can be restricted mainly to the longitudinal direction of the capacitor 6. Damage which may possibly occur to surroundings other than to the longitudinal direction can be limited.

Figure 2A:
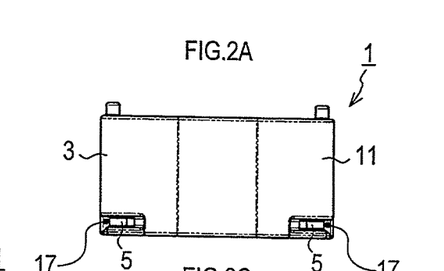
FIG. 2A is a plan view showing the capacitor holder.
Figure 2B:
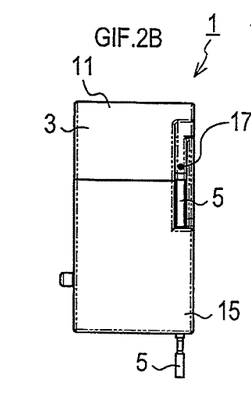
FIG. 2B is a left side view thereof.
Figures 2C, 2D:
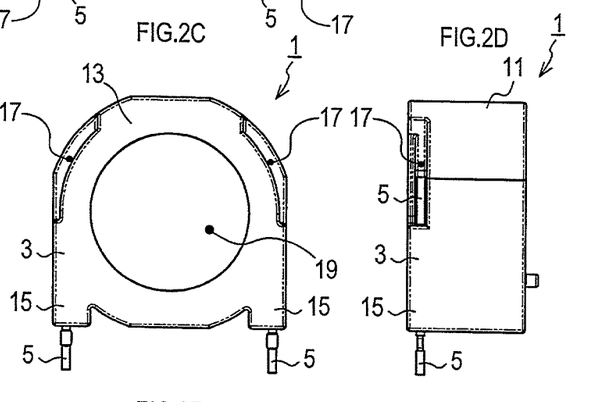
FIG. 2C is a front view thereof.
FIG. 2D is a right side view thereof.
Figure 2E:
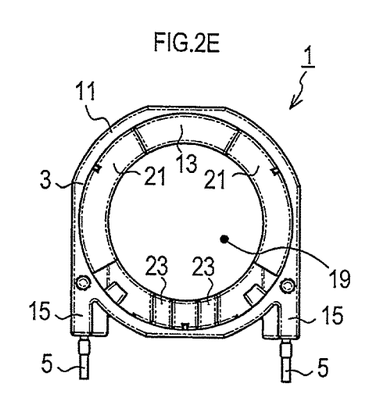
FIG. 2E is a rear view thereof.
Figure 2F:
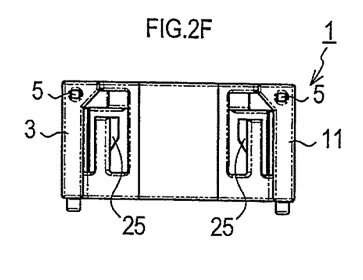
FIG. 2F is a bottom view thereof.
Figure 4B:
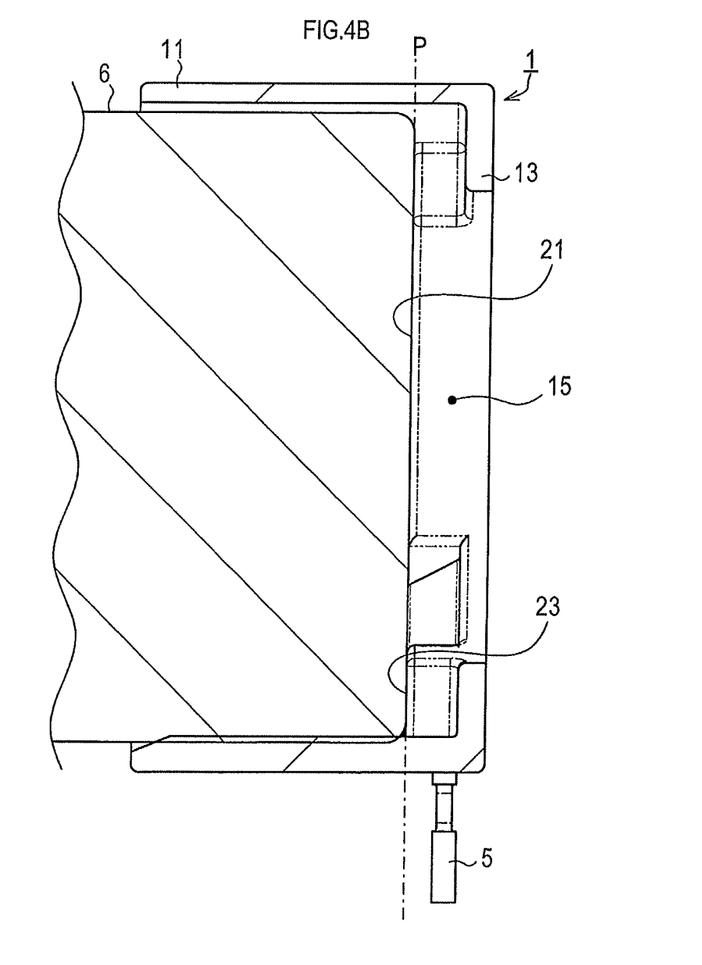
FIG. 4B is an explanatory view showing an enlarged portion of the cross-section taken along a line IVB-IVB shown in FIG. 4A.

On a back side of the end surface abutting portion 13, convex portions 21, 23 which protrude toward the back side are created, as shown in FIG. 2E. When the capacitor 6 is fitted into the body part 3, the end surface abutting portion 13 is configured to abut the tip end surface of the capacitor 6 at the convex portions 21, 23, as shown in FIG. 4B.

An elastic pressuring piece 25 is provided at a bottom of the cylindrical portion 11. When the capacitor 6 is fitted into the body part 3, the elastic pressuring piece 25 is elastically deformed and displaced toward an outer circumference of the capacitor 6 to be pressed against the outer circumference of the capacitor 6. Therefore, if such elastic pressuring piece 25 is provided, a tolerance in an outer peripheral dimension of the capacitor 6, if any, is absorbed by elastic deformation of the elastic pressuring piece 25. The capacitor 6 can then be tightly held.

Further, when the capacitor 6 is fitted into the body part 3, the elastic pressuring piece 25 is once caught by the end surface of the capacitor 6, and then, after the caught elastic pressuring piece 25 is released from the end surface of the capacitor 6, the capacitor 6 is pushed into a back of the body part 3.

Therefore, when the elastic pressuring piece 25 is released from the end surface of the capacitor 6, an appropriate sense of snap is produced. Immediately thereafter, since resistance due to the elastic pressuring piece 25 being caught is eliminated, the capacitor 6 is completely pushed into the body part 3 (the tip end surface of the capacitor 6 is in a state abutting the convex portions 21, 23).

Therefore, when pushing the capacitor 6 into the body part 3, a user can push the capacitor 6 into the body part 3 to an appropriate position, relying on the sense of snap. The user can keep in mind that the capacitor 6 should be pushed to an amount until a sense of snap can be obtained.

According to the capacitor holder 1 configured as above, it is possible to hold the capacitor 6 fitted into the body part 3 at a fitting location. Thus, even when vibration or impact is transmitted to the capacitor 6, it is possible to prevent an excessive load from being applied to the capacitor 6 due to the vibration or impact.

Further, in the capacitor holder 1, the lead parts 5 are fixed to the body part 3 at positions opposite to the capacitor 6 with respect to a reference plane P (see a dashed line in FIG. 4B) which is a plane including the tip end surface of the capacitor 6. Therefore, although a structure of the end surface side of the capacitor 6 becomes bulky to some extent due to presence of the lead parts 5, a lateral structure of the capacitor 6 never becomes a bulky structure.

Accordingly, if such capacitor holder 1 is fitted onto the capacitor 6, a dimension corresponding to a radial direction of the capacitor 6 can be reduced, even if a dimension corresponding to the longitudinal direction of the capacitor 6 is increased, as compared to a capacitor holder of which lead parts are disposed on lateral sides of the capacitor 6 (e.g., capacitor holder described in the above-described Patent Document 1).

Figure 5A:
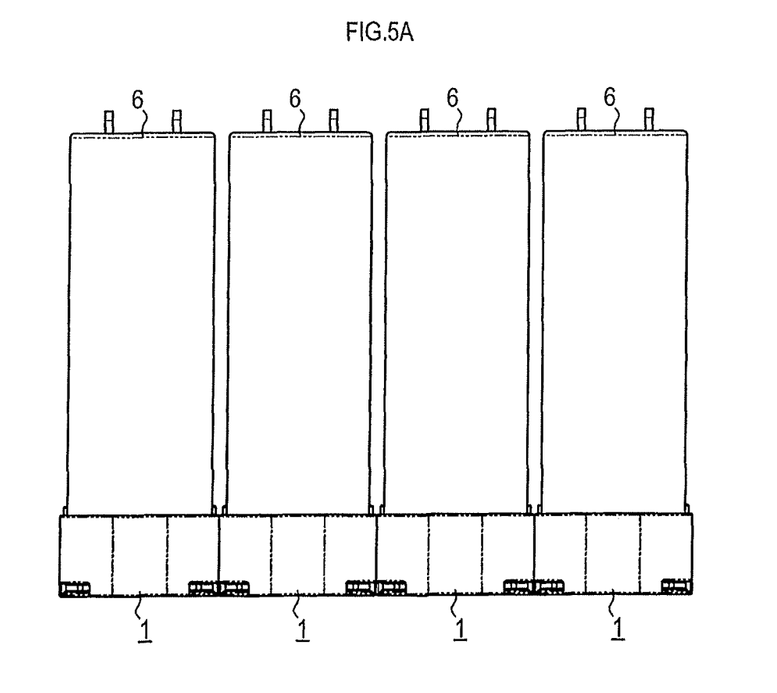
FIG. 5A is a plan view showing a use state of a plurality of capacitor holders arranged in parallel.
Figure 5B:
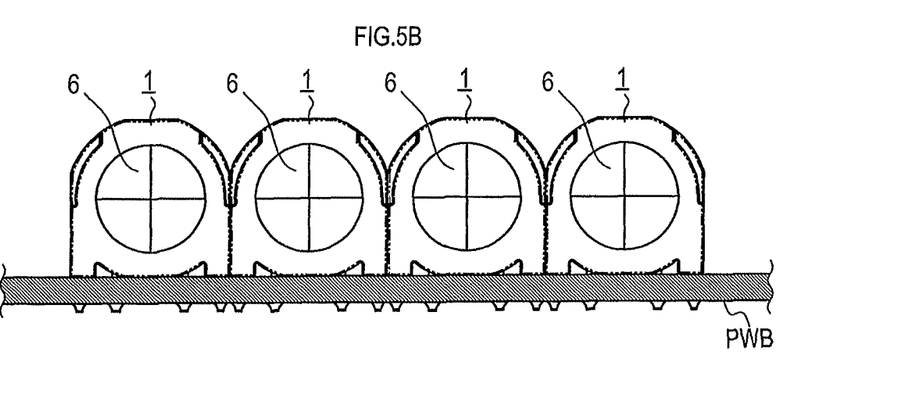
FIG. 5B is a front view showing a use state of a plurality of capacitor holders arranged in parallel.

Therefore, as shown in FIGS. 5A and 5B, when a plurality of capacitors 6 are mounted in parallel, use of the capacitor holder 1 can reduce spacing to be ensured between the adjacent capacitors 6, as compared to a case in conventional products, and improve package density of the capacitors 6 on a printed wiring board PWB.

Furthermore, if the capacitor 6 is held by the capacitor holder 1, a state is achieved in which the metal lead parts 5 are provided in a vicinity of an aluminum case which is an exterior of the capacitor 6. Thus, even if a noise current flows through the aluminum case, the noise current falls to the ground through the lead parts 5 due to capacitive coupling.

Thus, in this capacitor holder 1, different from a holder which is fixed to the printed wiring board PWB by an electrically insulating member which is not a metal lead part, it is possible to not only simply hold the capacitor 6 but also take measures against high-frequency noise of the capacitor 6.

Moreover, upon taking measures against such high-frequency noise, if the distance between the capacitor 6 and the lead parts 5 varies due to individual difference of the capacitor 6, variation occurs even in effect on the measures against high-frequency noise. In a case of the capacitor holder 1, since the tip end surface of the capacitor 6 abuts the convex portions 21, 23 (which are examples of the abutting portion referred to in the present invention) when the capacitor 6 is fitted into the body part 3, the distance between the tip end surface of the capacitor 6 and the lead parts 5 is exactly the distance set in the capacitor holder 1 side regardless of the tolerance in the longitudinal direction of the capacitor 6.

Thus, in such capacitor holder 1, it is possible to exert the effect on measures against high-frequency noise as described above in a stable manner, regardless of the tolerance in the longitudinal direction of the capacitor 6.

Although the embodiment of the present invention is described in the above, the present invention is not limited to the specific embodiment described above, and may be practiced in a variety of forms as well.

For example, in the above embodiment, although the elastic pressure piece 25 pressed against the outer circumference of the capacitor 6 is provided, whether or not to provide the elastic pressuring piece 25 is optional if the body part 3 is in a shape to which the tip end of the capacitor 6 can be press-fitted.

In the above-described embodiment, the description has been given on a case of holding the capacitor (electrolytic capacitor) having a pressure valve. It goes without saying that the present invention is also applicable to a capacitor that does not have a pressure valve, and the same effect is achieved as in the case of holding the electrolytic capacitor.

The invention claimed is:

1. A capacitor holder that can hold a capacitor, the capacitor holder comprising:
   a body part formed of an electrically insulating material, the body part being formed in a shape into which a tip end of the capacitor can be fitted; and
   a lead part formed of a metal material, the lead part being fixed to the body part and able to be soldered to a predetermined fitting location, the lead part being able to be capacitively coupled to a case which is in exterior of the capacitor,
   the body part having an abutment portion which abuts a tip end surface of the capacitor, when the tip end of the capacitor is fitted into the body part,
   the lead part being fixed to the body part at a position opposite to the capacitor with respect to a reference plane, which is a plane including the tip end surface of the capacitor abutting the abutment portion.

2. The capacitor holder according to claim 1, wherein the lead part is fixed to the body part at a position to overlap with the tip end surface of the capacitor, when viewed from a fitting direction upon fitting the tip end of the capacitor into the body part.

3. The capacitor holder according to claim 2, wherein
   the lead part is constituted by a pair of metal bodies spaced apart,
   portions continuous from one ends of the pair of metal bodies which are used for soldering extend parallel to part of a way to reach other ends of the pair of metal bodies, and are bent to directions to get closer to each other toward the other ends from a location part of the way, and portions which lead to the other ends from the location part of the way are fixed to the body part at the positions to overlap with the tip end surface of the capacitor, when viewed from the fitting direction upon fitting the tip end of the capacitor into the body part.

4. The capacitor holder according to claim 3, wherein the pair of metal bodies are arranged at positions to pass through holes formed in the body part by being press-fitted into the through holes, and portions continuous from the other ends, out of portions that protrude from both sides of the through holes, are bent to the directions to get closer to each other.

5. The capacitor holder according to claim 1, wherein the body part includes an elastic pressuring piece which is elastically deformed when the tip end of the capacitor is fitted into the body part, to be in a state pressed against an outer peripheral surface of the capacitor.

6. The capacitor holder according to claim 2, wherein the body part includes an elastic pressuring piece which is elastically deformed when the tip end of the capacitor is fitted into the body part, to be in a state pressed against an outer peripheral surface of the capacitor.

7. The capacitor holder according to claim 3, wherein the body part includes an elastic pressuring piece which is elastically deformed when the tip end of the capacitor is fitted into the body part, to be in a state pressed against an outer peripheral surface of the capacitor.

8. The capacitor holder according to claim 4, wherein the body part includes an elastic pressuring piece which is elastically deformed when the tip end of the capacitor is fitted into the body part, to be in a state pressed against an outer peripheral surface of the capacitor.

9. The capacitor holder according to claim 1, wherein the body part has an opening that exposes the tip end of the capacitor when the tip end of the capacitor is fitted into the body part.

10. The capacitor holder according to claim 2, wherein the body part has an opening that exposes the tip end of the capacitor when the tip end of the capacitor is fitted into the body part.

11. The capacitor holder according to claim 3, wherein the body part has an opening that exposes the tip end of the capacitor when the tip end of the capacitor is fitted into the body part.

12. The capacitor holder according to claim 4, wherein the body part has an opening that exposes the tip end of the capacitor when the tip end of the capacitor is fitted into the body part.

13. The capacitor holder according to claim 5, wherein the body part has an opening that exposes the tip end of the capacitor when the tip end of the capacitor is fitted into the body part.

14. The capacitor holder according to claim 6, wherein the body part has an opening that exposes the tip end of the capacitor when the tip end of the capacitor is fitted into the body part.

15. The capacitor holder according to claim 7, wherein the body part has an opening that exposes the tip end of the capacitor when the tip end of the capacitor is fitted into the body part.

16. The capacitor holder according to claim 8, wherein the body part has an opening that exposes the tip end of the capacitor when the tip end of the capacitor is fitted into the body part.

* * * * *